United States Patent
Tudman et al.

(10) Patent No.: US 12,004,300 B2
(45) Date of Patent: Jun. 4, 2024

(54) APPARATUS, SYSTEM, AND METHOD OF PROVIDING RADIAL SECTION IDENTIFICATION FOR PICK AND PLACE

(71) Applicant: JABIL INC., St. Petersburg, FL (US)

(72) Inventors: Mark Tudman, St. Petersburg, FL (US); Rayce Loftin, St. Petersburg, FL (US); Vincy Li, St. Petersburg, FL (US); Sundar Sethuraman, St. Petersburg, FL (US)

(73) Assignee: JABIL INC.

( * ) Notice: Subject to any disclaimer, the term of this patent is extended or adjusted under 35 U.S.C. 154(b) by 381 days.

(21) Appl. No.: 17/423,822

(22) PCT Filed: Jan. 17, 2020

(86) PCT No.: PCT/US2020/013992
§ 371 (c)(1),
(2) Date: Jul. 16, 2021

(87) PCT Pub. No.: WO2020/150549
PCT Pub. Date: Jul. 23, 2020

(65) Prior Publication Data
US 2022/0117125 A1    Apr. 14, 2022

Related U.S. Application Data

(60) Provisional application No. 62/793,711, filed on Jan. 17, 2019.

(51) Int. Cl.
*H05K 13/00* (2006.01)
*B25J 9/00* (2006.01)
(Continued)

(52) U.S. Cl.
CPC ........ *H05K 13/0015* (2013.01); *B25J 9/0096* (2013.01); *B25J 9/1697* (2013.01);
(Continued)

(58) Field of Classification Search
CPC ........... H05K 13/0015; H05K 13/0069; H05K 13/0404; H05K 13/0812; B25J 9/0096; B25J 9/1697; B25J 13/08
See application file for complete search history.

(56) References Cited

U.S. PATENT DOCUMENTS 6,591,219 B1 * 7/2003 Iisaka ................ H05K 13/0815
                                                                702/152
9,776,808 B1 * 10/2017 Ooba ................. B65G 47/1428
(Continued)

FOREIGN PATENT DOCUMENTS

CN    1309528 A    8/2001
EP    1077594 A2   2/2001
(Continued)

OTHER PUBLICATIONS

International Search Report for PCT/US2020/013992, dated Jul. 23, 2020.
(Continued)

*Primary Examiner* — Rachid Bendidi
(74) *Attorney, Agent, or Firm* — Riverside Law LLP

(57) ABSTRACT

An apparatus, system and method for placing components on a circuit board by a pick and place machine. The apparatus, system and method may include a rotational table suitable to receive and hold the circuit board for the pick and place machine; at least one sensor capable of sensing an off-center fiducial on the circuit board after association with the rotational table; and at least one processor connective with at least one computing memory having therein non-transitory computing code. The steps performed by execution of the code may include receiving sensor data from the sensor indicative of at least a physical location the off-center fiducial; dividing the board into radial sections based on the sensor data; accessing at least one placement program for placement of at least first components by the pick and place
(Continued)

machine; monitoring for a change to a second at least one of the radial sections based on rotation of the rotational table according to the sensor data; and accessing at least one second placement program for placement of second components upon a change to the physical location.

20 Claims, 4 Drawing Sheets

(51) Int. Cl.
    *B25J 9/16*     (2006.01)
    *B25J 13/08*     (2006.01)
    *H05K 13/04*     (2006.01)

(52) U.S. Cl.
    CPC .......... *B25J 13/08* (2013.01); *H05K 13/0069* (2013.01); *H05K 13/0404* (2013.01)

(56) References Cited

U.S. PATENT DOCUMENTS

| | | | |
|---|---|---|---|
| 2002/0071602 A1* | 6/2002 | Nakano | H05K 13/0812 |
| | | | 382/151 |
| 2008/0138175 A1* | 6/2008 | Mitchell | H01L 21/67745 |
| | | | 414/217 |

FOREIGN PATENT DOCUMENTS

| | | |
|---|---|---|
| JP | 09-018195 A | 1/1997 |
| KR | 10-0155793 B1 | 12/1998 |

OTHER PUBLICATIONS

Written Opinion of the International Searching Authority for PCT/US2020/013992, dated Jul. 23, 2020.

* cited by examiner

APPARATUS, SYSTEM, AND METHOD OF PROVIDING RADIAL SECTION IDENTIFICATION FOR PICK AND PLACE

CROSS-REFERENCE TO RELATED APPLICATIONS

This application is a national stage application of International Patent Application PCT/US2020/013992, filed Jan. 17, 2020, entitled Apparatus, System, and Method of Providing Radial Section Identification for Pick and Place," which claims benefit of priority to U.S. Provisional Application No. 62/793,711, filed Jan. 17, 2019, entitled: "Apparatus, System, and Method of Providing Radial Section Identification for Pick and Place," the entirety of which is incorporated herein by reference as if set forth in its entirety.

BACKGROUND

Field of the Disclosure

The disclosure relates generally to circuit board manufacturing, and, more particularly, to an apparatus, system, and method of providing radial section identification for pick and place on a circuit board.

Background of the Disclosure

Surface mount technology (SMT) is a technology used to create completed printed circuit boards (PCBs). Typically, a circuit board substrate receives a plurality of traces thereon, and thereafter the SMT components are mounted to the surface of the PCB in a manner that provides conductivity through the traces between the SMT components, thereby providing a plurality of complete circuits in which the SMT components can operate.

SMT component placement systems, commonly called "pick-and-place', or "P&P", machines, are generally electromechanical/robotic machines used to place SMT components onto the PCB. Such pick and place machines are often used for high speed, high precision placing of a broad range of electronic components, such as capacitors, resistors, transistors, and integrated circuits (ICs) onto the PCB. After placing of components, the PCB may be used in a computer, a consumer electronic, or industrial, medical, automotive, military and telecommunications equipment. Similar pick and place machines are also used for so-called "through hole" components, which are placed within mounting holes in the PCB, and which are thereafter mounted to the PCB.

The pick and place machine may use several sub-systems to work together to pick up and correctly place the SMT or through-hole components onto the PCB. These systems may use pneumatic suction cups or grips on the robotic arms of the machine to seize the components to be placed, wherein these cups or grips may be attached to a plotter-like device that allows the cups or grips to be accurately manipulated in three dimensions.

The SMT components are typically placed along the front, back, and/or side faces of the machine to allow for seizure by the robotic arms. The components may be supplied on paper or plastic tape, for example, and may be on tape reels that are loaded onto feeders mounted to the pick and place machine. Larger (ICs) may be arranged in trays which are stacked in a compartment of the machine, and more typically-sized ICs in tapes as discussed above.

Through the middle of the pick and place machine may pass one or more conveyor belts. Blank PCBs travel along the conveyer into the pick and place machine, and each PCB is then serially clamped in order to be subjected to the cups/nozzles and robotic arms that pick up the individual SMT components from the feeders/trays, rotate them to the correct orientation, and then place them on the appropriate pads on the PCB with high precision.

Presently, pick and place is typically limited to relatively small boards, so as to minimize the need for multiple robots and/or the need to rotate or otherwise move the board to enable pick and place on larger boards. Some larger scale boards are subjected to pick and place, but placement of components as and if the board is rotated in such circumstances greatly adds to the complexities of board assembly.

SUMMARY OF THE DISCLOSURE

The disclosure is and includes at least an apparatus, system and method for placing components on a circuit board by a pick and place machine. The apparatus, system and method may include a rotational table suitable to receive and hold the circuit board for the pick and place machine; at least one sensor capable of sensing an off-center fiducial on the circuit board after association with the rotational table; and at least one processor connective with at least one computing memory having therein non-transitory computing code. When the non-transitory code is executed by the processor, performed are the steps of: receiving sensor data from the sensor indicative of at least a physical location the off-center fiducial; dividing the board into radial sections based on the sensor data; accessing at least one placement program for placement of at least first components by the pick and place machine into a first at least one of the radial sections according to the physical location; monitoring for a change to a second at least one of the radial sections based on rotation of the rotational table according to the sensor data; and accessing at least one second placement program for placement of second components by the pick and place machine into a second at least one of the radial sections upon a change to the physical location.

BRIEF DESCRIPTION OF THE DRAWINGS

The disclosure is illustrated by way of example and not limitation in the accompanying drawings, in which like references may indicate similar elements, and in which.

DETAILED DESCRIPTION

Figure 1:
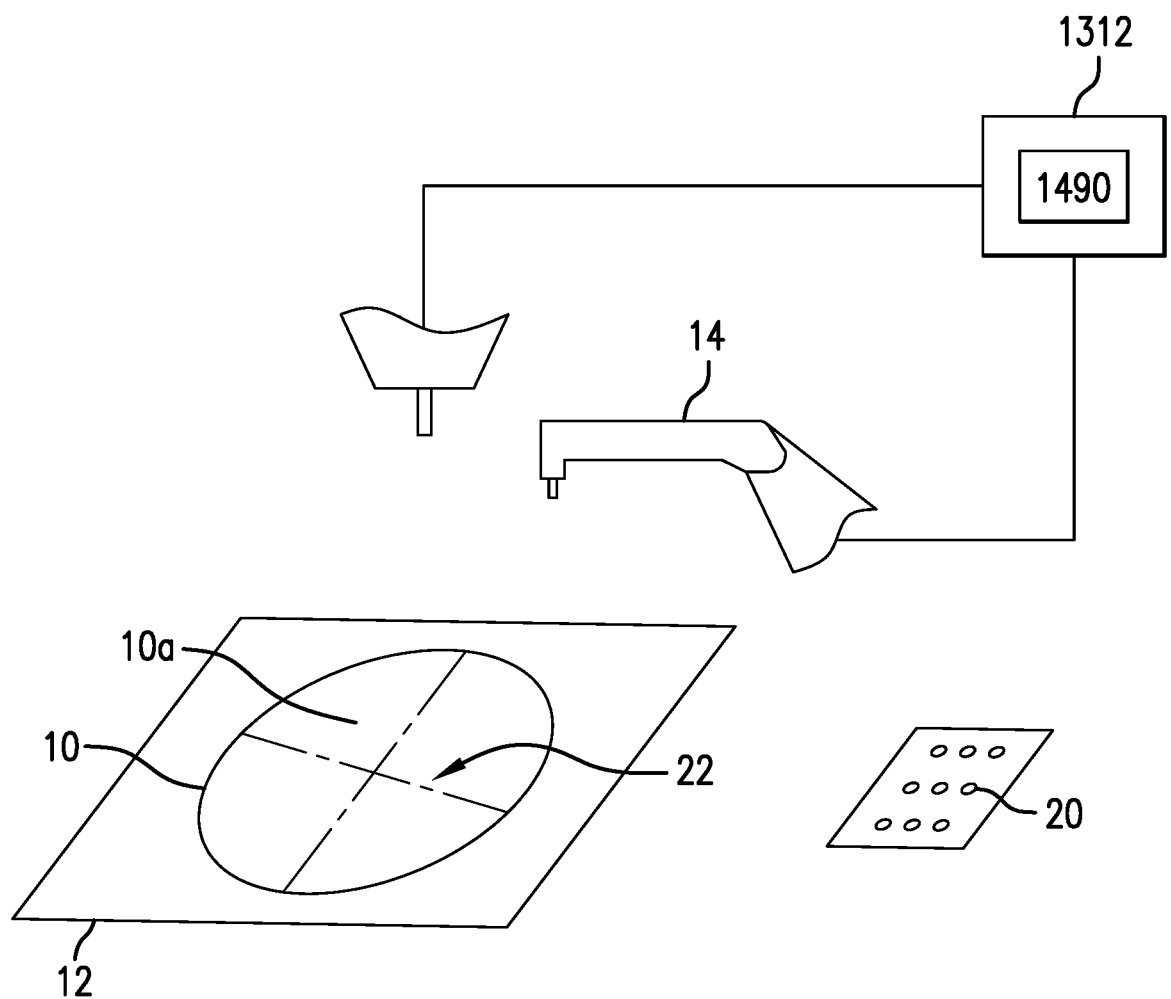
FIG. 1 is an illustration of a circuit board associated with a rotational table.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second," and other numerical terms, when used herein, do not imply a sequence or order unless clearly indicated by the context. Thus, a first element, component, region, layer or section discussed below could be termed a second element, component, region, layer or section without departing from the teachings of the exemplary embodiments.

Processor-implemented modules, systems and methods of use are disclosed herein that may provide access to and transformation of a plurality of types of digital content, including but not limited to video, image, text, audio, metadata, algorithms, interactive and document content, and which track, deliver, manipulate, transform, transceive and report the accessed content. Described embodiments of these modules, systems and methods are intended to be exemplary and not limiting. As such, it is contemplated that the herein described systems and methods may be adapted and may be extended to provide enhancements and/or additions to the exemplary modules, systems and methods described. The disclosure is thus intended to include all such extensions.

As discussed above, larger scale wafer processing may be most readily accomplished of the subject circuit board is rotated to allow for pick and place operations. However, such board rotation has generally added great complexity to the pick and place process, at least because of the need to very precisely maintain an awareness of board positioning to allow for refined placement of, for example, SMT components.

A rotary table is a precision work positioning device often used in metalworking. It enables drilling, cutting, and component placement exact radial intervals around a fixed axis—typically a fixed center vertical axis. A rotary table may be manually or automatically operated. That is, a rotating disc of the table to which the work item is clamped, clipped, or otherwise temporarily attached may rotate freely, may be indexed, i.e., positionally tracked, in an automated manner, or may rotate under manual control, such as under the control of a handwheel attached to a worm gear.

The workpiece must be accurately centered on the rotary table's center vertical axis, which must, in turn, be centered with the working tool's axis, thereby making the axes coaxial. This allows concentric and radial machining operations on the workpiece, as long as the tool axis and the workpiece axis remain coaxial. Of course, such refined coaxiality is exceedingly difficult to maintain if the workpiece is moved, such as by rotation of the rotary table.

It has been proposed that tables similar to a rotary table be used in pick and place operations for SMT components, such as for larger boards. However, for larger circuit boards, and particularly for circuit boards that may be subjected to automated placement by multiple pick and place robots traversing multiple paths, the identification of the board's current location, and more particularly the location of each radial slice of the board, in space, and consequently, the precise location at which each component is to be placed on the board, becomes exceedingly difficult. In such instances, highly complex programming, and hence very significant processing resources, are typically required in order to identify aspects of the Board, and to continuously process a mapping of those aspects, such that the precise location for the pick and place robot can be ascertained at all times. This is necessary at least so as to avoid misplacement of components on the board, and further to avoid catastrophic process and/or machine breakdown.

FIG. 1 illustrates a large, substantially circular circuit board 10, such as may be approximately or greater than 1 meter in diameter, for association with a rotation-capable, i.e., a "rotational", table 12 which subjects the illustrated circuit board 12 to at least one pick and place process 14, such as by subjecting the board to one or more pick and place robots. Accordingly, the disclosed embodiments allow for a reorientation, such as a rotation, of the illustrated circuit board 10 by the rotary table 12, while maintaining a strict positional awareness of the board's radial aspects 10a with respect to robots 14 without the need for an extraordinary level of processing by controlling processing system 1312.

As will be understood in light of the discussion herein, the reorientation of the board 10 discussed throughout may occur manually or automatically without departing from the disclosure. Further, the reorientation discussed throughout, upon execution by the rotational table 12, is presumed to also reorient the illustrated circuit board 10 with respect to the one or more pick and place robots 14 that pick and place components 20, such as SMT components, onto the illustrated board 10.

In the known art, it is typical that a board positional assessment is made using a fiducial provided in association with the board. It is typically the case that this fiducial is at the center of the Board, and as such, as the board is rotated, i.e., moved radially/rotationally, the provided fiducial does not change location, and thereby offers little that is suitable to allow for an automated assessment of board position without significant processing.

However, it is also typically the case that a board such as the one shown may also include a so-called "bad board" marker 22. It is typical that this marker 22 is used to indicate a flawed printed circuit board, such that the board will be discarded or otherwise go unused. Contrary to this known use, some disclosed embodiments use this bad board marker as a fiducial because, unlike the typical center fiducial, the bad board marker provides an off-center fiducial 22 by which the processing system 1312 disclosed herein can divide the board into identifiable quadrants. And, as the bad board fiducial is off-center, the radial quadrants and slices 10a are readily identifiable from this bad board fiducial even as the board is reoriented, such as when the board is being rotated.

Figure 2:
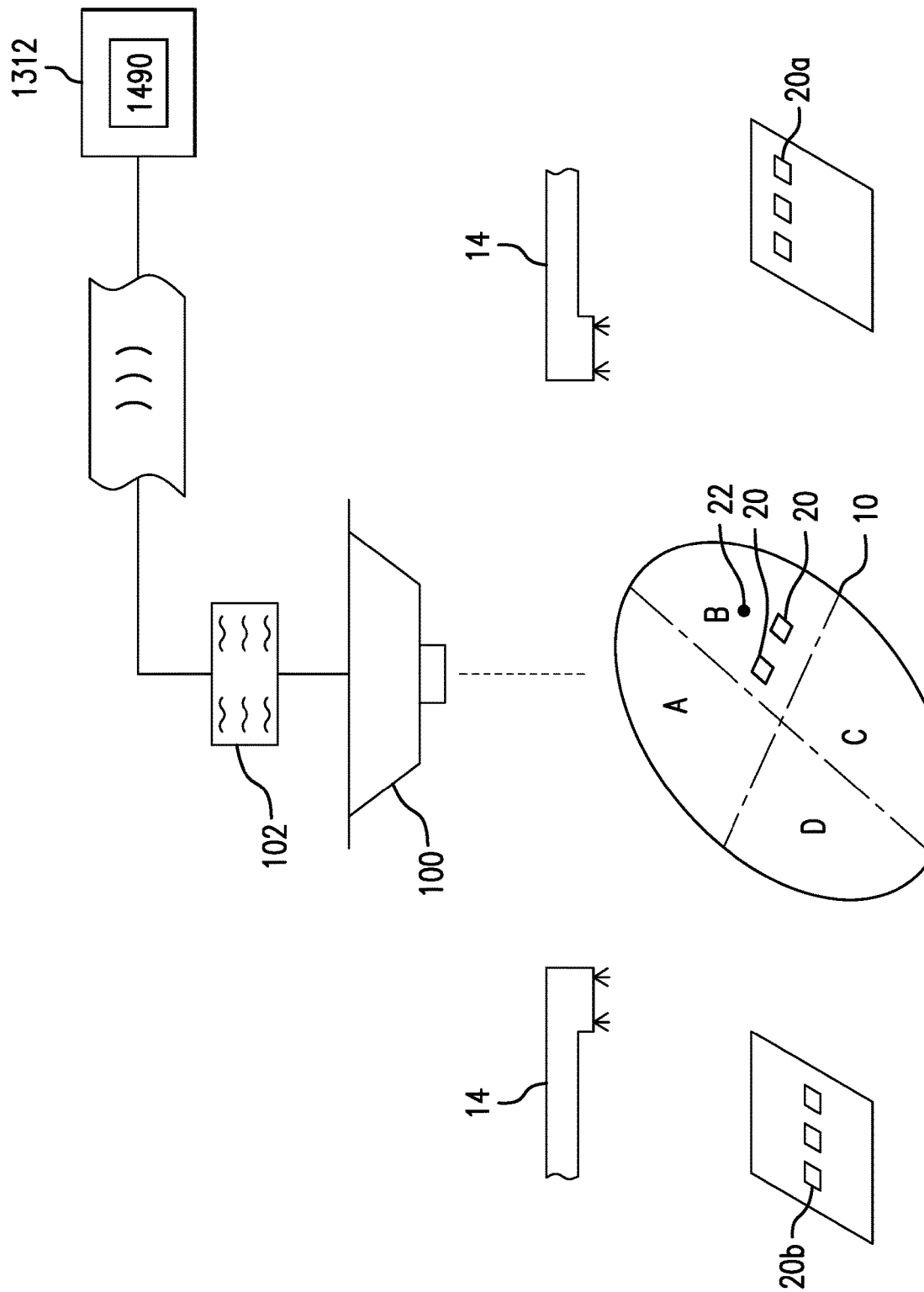
FIG. 2 is an illustration of a sensing system for a pick and place machine.

More particularly, FIG. 2 illustrates the association of at least one sensor 100 with a system for viewing and positionally assessing the circuit board 10 discussed herein. The sensor 100 sends the data 102 generated from the sensor 100 to at least one processing system 1312. The sensor 100 may be, by way of nonlimiting example, an optical camera, and the sensor 100 may particularly assess the position of the off-center fiducial 22 discussed herein.

The sensing 100, in conjunction with the processing by the processing system 1312, allows for the physical treatment and digital creation of identifiable quadrants (A, B, C, D), halves, or a similar delineation of radial board aspects to be subjected to the picking and placement of components 20 onto the board 10, as performed by the pick and place robots 14 discussed herein. It will be appreciated that, in performance of the processes discussed herein, multiple robots 14 may perform pick and place for any given quadrant or quadrants (or halves, or other sections) simultaneously or independently without departing from the disclosure. For example, each quadrant may, in association with one or more algorithms/applications 1490 executed by the processing system 1312, have an algorithmic pattern for the placement of low-profile components, and a second algorithmic pattern for placement of high-profile components, and these algorithmic patterns may be variably keyed to a board position as indicated by the sensor reading of the bad board fiducial (or other off-center fiducial) 22.

In such an exemplary circumstance, either of the multiple aforementioned robots 14 may perform pick and placed simultaneously in a given quadrant, or in a staggered manner for a given quadrant, based on the positional assessment of each radial section (i.e., quadrants "A", "B", "C", "D") as indicated to the sensor 100 by the location of the off-center fiducial 22. That is, one robot 14 may place the low-profile components 20a in a quadrant, and one robot 14 may place the high-profile components 20b, or a single robot 14 may place both types of components 20 in a given quadrant. These placements may be keyed algorithmically to the sensed off-center fiducial 22, and may comprise a unique algorithm for each placement quadrant and/or each component(s) 20 to be placed.

Each unique algorithm 1490 mentioned above may occur during execution of a single program 1490 and/or computing code operation 1490, such as for a particular board type and/or size, as discussed herein throughout. In relation to the foregoing example, the components 20 may be placed in a staggered manner by being subjected to a first quadrant component placement program/algorithm 1490 for low for low-profile components 20 in a quadrant, and then a second high-profile component placement program/algorithm 1490 for high-profile components 20 in the same quadrant, by way of non-limiting example.

In accordance with the foregoing, at least upon each reorientation of the subject circuit board 10, the sensor 100 may renew its viewing of the location of the bad off-center fiducial 22, send this data to the processing system 1312, and accordingly the processing system 1312, using application/program/algorithm 1490, may reassess the positions of each of the four identifiable quadrants (or halves, eighths, etc.) before executing a placement aspect of program 1490. Of course, it will be appreciated in light of the discussion herein that quadrant identification using sensor tracking of the bad board marker, or other off-center fiducial 22, may also occur continuously, or may be performed only upon initial association of the circuit board 10 with the rotational table 12, such as for automated embodiments in which the rotational table 12 itself is capable of providing a refined indexing of the board's position at all times to the processing system 1312, and consequently to the pick and place robots 14 executing the placement aspects of program 1490.

More specifically, in a detailed exemplary embodiment, a machine vision sensor may, upon association of an approximately 1 m dia. circuit board with the rotational table in the disclosed system, assess the position of the board based on the location of that board's bad board marker, and consequently may allow for a processing system to generate a precise layout of X and Y coordinates for board locations along the four quadrants discussed herein. This coordinate grid may then be overlayed with a similar global coordinate grid by which the pick and place robots execute component placements.

Additionally and alternatively in this example, this initial machine vision sensing may be repeated each time the board is rotated, such as each time the board is rotated by 90°. Yet further, this machine vision sensing may not be repeated, but instead the indexing of the board automatically by the rotational table may be employed by the processing system to continuously redefine the board quadrants' coordinates for the pick and place robot. On the other hand, the exemplary machine vision sensing may operate continuously, such as whether or not the board is continuously rotated, or when the board is discreetly rotated in 45° or 90° increments, by way of nonlimiting example.

The embodiments may be operable for any rotational table that subjects a circuit board to a pick and place machine. In the embodiments, the manufacture of a series of circuit boards, such as using the conveyer pick and place system discussed herein above, needn't be serially stopped if one board in the process needs to be checked and re-inserted. That is, in prior art embodiments, to the extent a board needed to be checked, such as manually or automatically, it has generally been the case that a checked board would often be misloaded back into the assembly-line, which could cause destruction of the board, destruction of components, a decrease in board yield rate, and/or a breakdown of the entire assembly-line.

In contrast to the prior art, the embodiments allow for corrective action even in the event of a misloaded board, at least because the embodiments allow for a sensing of the bad board marker and a consequent reorienting of the component placement coordinates by the processing system each time the board is loaded or reloaded to a rotational table. Therefore, the embodiments ensure proper processing of each board and placement of the components for each board pursuant to corrected execution of the appropriate pick and place program unique to each quadrant of the board and unique to component types within each quadrant. This corrected program execution occurs at least pursuant to the reassessment of the position coordinates of the quadrants, based on sensing of an off-center fiducial, prior to execution of any pick and place programming.

Figure 3:
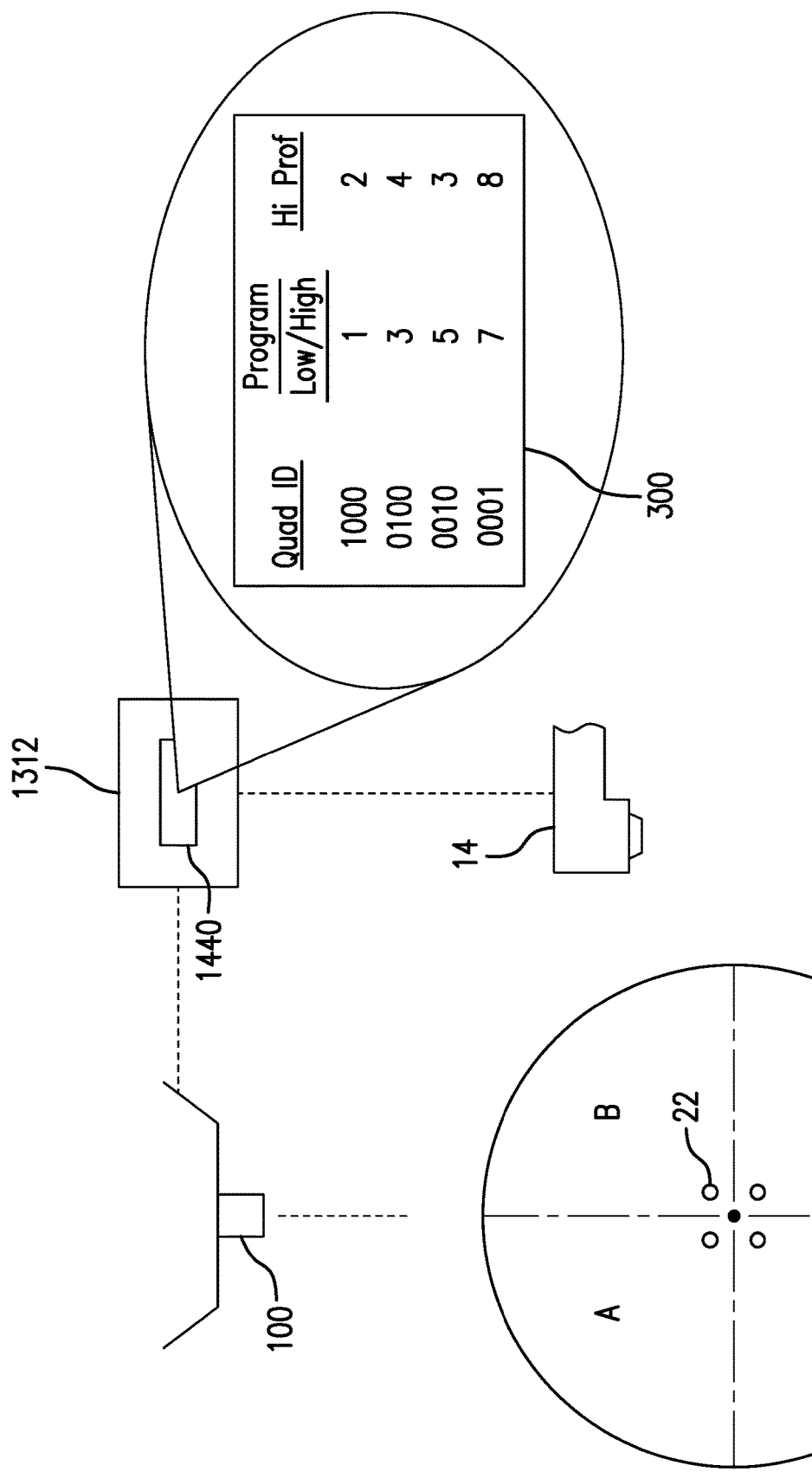
FIG. 3 is an illustration of a board subjected to a quadrant placement program.

FIG. 3 illustrates a particular exemplary circuit board 10 that may be associated with a rotational table and at least one pick and place robot 14 to which the board 10 is to be subjected. Also illustrated is the disclosed sensor 100 for sensing the off-center fiducial 22, and a processing system 1312 associated with the sensor, wherein the processing system has been preprogrammed with eight programs 300, i.e., two programs per quadrant, and one program for each type of component to be placed in each quadrant, to be executed by a pick and place machine that places the components in each of the four quadrants. More particularly, the illustration shows an execution by the processing system 1312 of distinct low-profile and high-profile placement programs 300 in each quadrant by a pick and place robot 14.

As shown, the sensor 100 has located the bad board marker 22 in a position that the processing system 1312 has associated within its programming as quadrant "B". In the illustration and solely by way of example, the processing system 1312 assigns its four quadrants in a clockwise fashion, and uses the sensor 100, such as machine vision, disclosed herein to assess into which quadrant the bad board marker 22 falls. The X-Y coordinates for placement within that quadrant can then be set by the program 300. Of course, it will be appreciated in light of the discussion herein that the processing system 1312 could make this assessment in a different manner, such as always assigning the quadrant in which the bad board marker 22 resides as quadrant "A", by way of nonlimiting example, without departing from the disclosure.

As referenced, the program 300/1490 of the processing system 1312, such as uniquely for each board as in the example shown, may have multiple, such as two, distinct sub-programs assigned to run in each respective quadrant in order to properly place different component types, such as low-profile and high-profile components, in each distinct quadrant. Thus, upon assessment by the sensor 100 of the location of each quadrant, the processing system 1312 may assess the presence of, or the need to move, a particular quadrant to be proximate to and underneath the at least one pick and place robot 14. Once an assessment is made from the data of the sensor 100 that the desired quadrant is at least sufficiently proximate to the correct pick and place robot 14, the X-Y placement coordinates may be set for the pick and place robot 14 on the board 10, and the robot 14 may begin execution of one of its programs (or sub-programs) 300/1490 for association with that quadrant, such as executing the low-profile component placement program for that quadrant.

It will be understood that, although the entire quadrant may be in position for the pick and place robot to execute the entirety of either or both of its programs for a given quadrant in the foregoing illustration, this may not be the case in some cases. That is, in circumstances where the pick and place robot cannot "reach" certain aspects of a given quadrant, the subject circuit board may be manually or automatically reoriented, such as under the direction of the processing system and such as based on the placement program selected for execution, to place previously unavailable aspects of a given quadrant within reach of the proper pick and place robot—which thus allows for completion of the execution of the given program. Likewise, the subject circuit board may be substantially continuously reoriented, such as at a predetermined rate elected by and/or otherwise known to the processing system, such that new aspects of a given quadrant are substantially continuously moved to within reach of the one or more pick and place robots as components are being placed.

Figure 4:
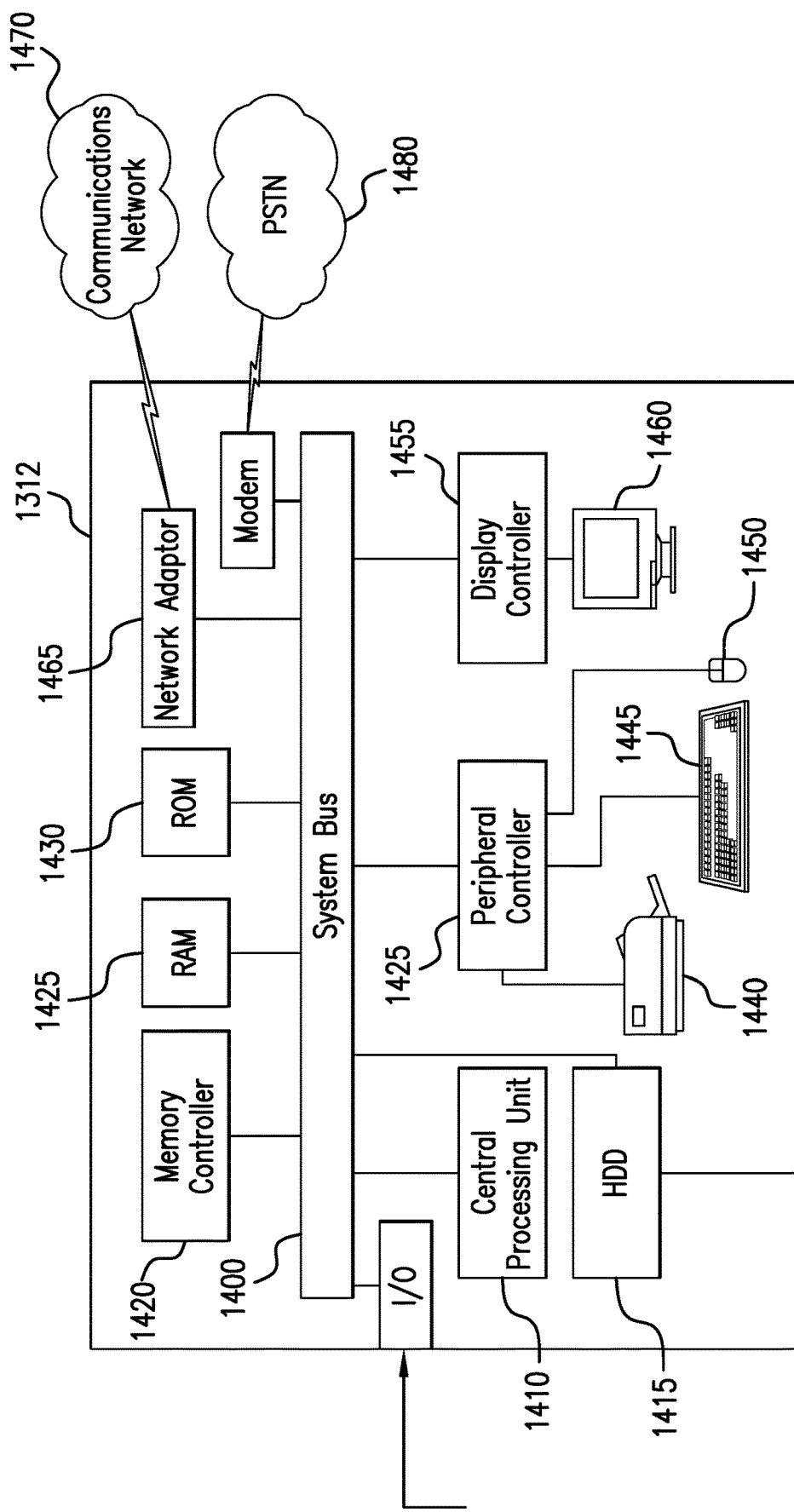
FIG. 4 is an illustration of a processing system.

FIG. 4 depicts an exemplary computer processing system 1312 for use in association with the embodiments, by way of non-limiting example. Processing system 1312 is capable of executing software, such as an operating system (OS), applications, user interface, and/or one or more other computing algorithms/applications 1490, such as the recipes, programs and subprograms discussed herein. The operation of exemplary processing system 1312 is controlled primarily by these computer readable instructions/code 1490, such as instructions stored in a computer readable storage medium, such as hard disk drive (HDD) 1415, optical disk (not shown) such as a CD or DVD, solid state drive (not shown) such as a USB "thumb drive," or the like. Such instructions may be executed within central processing unit (CPU) 1410 to cause system 1312 to perform the disclosed operations, comparisons and calculations. In many known computer servers, workstations, personal computers, and the like, CPU 1410 is implemented in an integrated circuit called a processor.

It is appreciated that, although exemplary processing system 1312 is shown to comprise a single CPU 1410, such description is merely illustrative, as processing system 1312 may comprise a plurality of CPUs 1410. Additionally, system 1312 may exploit the resources of remote CPUs (not shown) through communications network 1470 or some other data communications means 1480, as discussed throughout.

In operation, CPU 1410 fetches, decodes, and executes instructions from a computer readable storage medium, such as HDD 1415. Such instructions may be included in software 1490. Information, such as computer instructions and other computer readable data, is transferred between components of system 1312 via the system's main data-transfer path. The main data-transfer path may use a system bus architecture 1405, although other computer architectures (not shown) can be used.

Memory devices coupled to system bus 1405 may include random access memory (RAM) 1425 and/or read only memory (ROM) 1430, by way of example. Such memories include circuitry that allows information to be stored and retrieved. ROMs 1430 generally contain stored data that cannot be modified. Data stored in RAM 1425 can be read or changed by CPU 1410 or other hardware devices. Access to RAM 1425 and/or ROM 1430 may be controlled by memory controller 1420.

In addition, processing system 1312 may contain peripheral communications controller and bus 1435, which is responsible for communicating instructions from CPU 1410 to, and/or receiving data from, peripherals, such as peripherals 1440, 1445, and 1450, which may include printers, keyboards, and/or the operator interaction elements discussed herein throughout. An example of a peripheral bus is the Peripheral Component Interconnect (PCI) bus that is well known in the pertinent art.

Operator display 1460, which is controlled by display controller 1455, may be used to display visual output and/or presentation data generated by or at the request of processing system 1312, such as responsive to operation of the aforementioned computing programs/applications 1490. Such visual output may include text, graphics, animated graphics, and/or video, for example. Display 1460 may be implemented with a CRT-based video display, an LCD or LED-based display, a gas plasma-based flat-panel display, a touch-panel display, or the like. Display controller 1455 includes electronic components required to generate a video signal that is sent to display 1460.

Further, processing system 1312 may contain network adapter 1465 which may be used to couple to external communication network 1470, which may include or provide access to the Internet, an intranet, an extranet, or the like. Communications network 1470 may provide access for processing system 1312 with means of communicating and transferring software and information electronically. Additionally, communications network 1470 may provide for distributed processing, which involves several computers and the sharing of workloads or cooperative efforts in performing a task, as discussed above. Network adaptor 1465 may communicate to and from network 1470 using any available wired or wireless technologies. Such technologies may include, by way of non-limiting example, cellular, Wi-Fi, Bluetooth, infrared, or the like.

In the foregoing Detailed Description, it can be seen that various features are grouped together in a single embodiment for the purpose of clarity and brevity of the disclosure. This method of disclosure is not to be interpreted as reflecting an intention that the embodiments require more features than are expressly recited herein. Rather, the disclosure is to encompass all variations and modifications to the disclosed embodiments that would be understood to the skilled artisan in light of the disclosure.

What is claimed is:

1. A system for placing components on a circuit board by a pick and place machine, comprising:
   a rotational table suitable to receive and hold the circuit board for the pick and place machine;
   at least one sensor configured to sense an off-center fiducial on the circuit board after association with the rotational table;
   at least one processor connective with at least one computing memory having therein non-transitory computing code which, when executed by the at least one processor, causes the at least one processor to perform the steps of:
   receiving sensor data from the at least one sensor indicative of at least a physical location of the off-center fiducial;
   dividing the circuit board into radial sections based on the sensor data;
   accessing at least one placement program to determine a for placement of at least first components by the pick and place machine into a first at least one of the radial sections according to the physical location of the off-center fiducial;
   monitoring for a change to a second at least one of the radial sections based on rotation of the rotational table according to the sensor data; and
   accessing at least one second placement program to determine a placement of second components by the pick and place machine into the second at least one of the radial sections upon a change to the physical location of the off-center fiducial.

2. The system of claim 1, wherein the off-center fiducial comprises a bad board marker.

3. The system of claim 1, wherein the at least one sensor comprises an optical camera.

4. The system of claim 1, wherein the radial sections comprise radial quadrants.

5. The system of claim 1, wherein the rotational table comprises a rotary table.

6. The system of claim 1, wherein the first components comprise one of low-profile components or high-profile components.

7. The system of claim 1, wherein the sensing data is continuously generated.

8. The system of claim 1, wherein the sensing data is generated only upon rotation of the rotational table.

9. The system of claim 1, wherein the rotational table further comprises an indexing sensor, and wherein the indexing sensor is also indicative of the physical location.

10. The system of claim 1, wherein the placements are performed by at least one robot of the pick and place machine.

11. The system of claim 10, wherein the at least one robot comprises two robots.

12. The system of claim 11, wherein the two robots operate simultaneously.

13. The system of claim 11, wherein the two robots operate staggered.

14. The system of claim 1, wherein the at least one sensor comprises machine vision.

15. The system of claim 1, wherein the physical location comprises a template of X and Y coordinates.

16. The system of claim 1, wherein the rotational table rotates the circuit board by about 90° at each rotation.

17. The system of claim 1, wherein the circuit board is one in a series of a plurality of circuit boards conveyed through the pick and place machine.

18. The system of claim 1, wherein the at least first components comprise first and third components subjected to the at least one placement program.

19. The system of claim 1, wherein the radial sections are divided clockwise based on the radial section that includes the off-center fiducial.

20. The system of claim 1, wherein the at least one sensor is directed only at one radial section.

* * * * *